United States Patent
Bazarsky et al.

(10) Patent No.: US 11,619,984 B2
(45) Date of Patent: *Apr. 4, 2023

(54) EFFICIENT POWER MANAGEMENT MODES FOR MULTIPLE MEMORY DEVICES

(71) Applicant: Western Digital Technologies, Inc., San Jose, CA (US)

(72) Inventors: Alexander Bazarsky, Holon (IL); Tomer Tzvi Eliash, Kfar Saba (IL); Yuval Grossman, Kiryat Ono (IL)

(73) Assignee: Western Digital Technologies, Inc., San Jose, CA (US)

( * ) Notice: Subject to any disclaimer, the term of this patent is extended or adjusted under 35 U.S.C. 154(b) by 167 days.

This patent is subject to a terminal disclaimer.

(21) Appl. No.: 16/937,455

(22) Filed: Jul. 23, 2020

(65) Prior Publication Data

US 2020/0356157 A1   Nov. 12, 2020

Related U.S. Application Data

(63) Continuation of application No. 16/140,448, filed on Sep. 24, 2018, now Pat. No. 10,739,839.

(51) Int. Cl.
*G06F 1/26* (2006.01)
*G06F 1/32* (2019.01)
(Continued)

(52) U.S. Cl.
CPC .......... *G06F 1/3275* (2013.01); *G06F 1/3287* (2013.01); *G06F 3/0625* (2013.01); *G11C 16/12* (2013.01)

(58) Field of Classification Search
CPC .................................................. G06F 1/3275
See application file for complete search history.

(56) References Cited

U.S. PATENT DOCUMENTS 7,339,829 B2    3/2008  Sarig
8,331,134 B2    12/2012 Chiu et al.
(Continued)

OTHER PUBLICATIONS

M31 Technology, "SMIC and M31 Introduce Differential IP Solutions for Various Storage Controller Applications," Dec. 2015, retrieved from http://www.m31tech.com/eng/news/media_content.html?url=media_2015210.html, 2 pages.

*Primary Examiner* — Mohammed H Rehman
(74) *Attorney, Agent, or Firm* — Morgan, Lewis & Bockius LLP

(57) ABSTRACT

Disclosed are systems and methods for efficient power management for storage devices. A method includes receiving a request to transition a flash memory to a first stand-by mode, wherein the flash memory comprises a plurality of dies. The method also includes causing one or more guard dies of the plurality of dies to transition to the first stand-by mode while causing one or more other dies of the plurality of dies to transition to a second stand-by mode, wherein the second stand-by mode is configured to consume less power than the first stand-by mode. The method also includes receiving an input/output (I/O) request for the flash memory. The method also includes causing the I/O request to be performed on the one or more guard dies that are in the first stand-by mode but not in the second stand-by mode.

20 Claims, 6 Drawing Sheets

(51) Int. Cl.
*G06F 1/3234* (2019.01)
*G11C 16/12* (2006.01)
*G06F 3/06* (2006.01)
*G06F 1/3287* (2019.01)

(56) References Cited

U.S. PATENT DOCUMENTS

| | | |
|---|---|---|
| 9,111,639 B2 | 8/2015 | Hong et al. |
| 9,141,299 B2 | 9/2015 | Grimsrud et al. |
| 9,183,896 B1 | 11/2015 | Adams |
| 9,443,600 B2 | 9/2016 | Ghalam et al. |
| 9,507,534 B2 | 11/2016 | Ziakas |
| 9,564,180 B1 | 2/2017 | Pilo |
| 9,658,789 B2 | 5/2017 | Erez |
| 10,339,995 B2 | 7/2019 | Do |
| 2003/0149840 A1* | 8/2003 | Bolt .................. G06F 1/3221 711/114 |
| 2009/0182965 A1* | 7/2009 | Norman ................ G11C 5/02 711/163 |
| 2011/0119445 A1* | 5/2011 | Gooding ............ G06F 9/30072 711/122 |
| 2011/0250928 A1 | 10/2011 | Schlub |
| 2014/0156882 A1 | 6/2014 | Yoon et al. |
| 2016/0313946 A1 | 10/2016 | Zang et al. |

\* cited by examiner

EFFICIENT POWER MANAGEMENT MODES FOR MULTIPLE MEMORY DEVICES

CROSS-REFERENCE TO RELATED APPLICATION

This application is a continuation of application Ser. No. 16/140,448, filed on Sep. 24, 2018, now U.S. Pat. No. 10,739,839, the entirety of which is incorporated herein by reference for all purposes.

BACKGROUND

To extend the battery life of portable devices and to reduce the operating costs of high performance storage for workstation and data center applications, storage devices may enter into low power stand-by modes to reduce power consumption during periods of low input/output (I/O) activity. Current approaches to stand-by modes may require the storage device to remain active to service I/O requests in a timely fashion during periods of low I/O activity, preventing efficient utilization of stand-by modes. Further, high-performance multi-die storage devices may require selective binning of dies to meet power consumption targets for various applications and use cases, which increases costs for manufacturers and end users. There is thus a need for a more efficient method of power management for storage devices.

The description provided in the background section should not be assumed to be prior art merely because it is mentioned in or associated with the background section. The background section may include information that describes one or more aspects of the subject technology.

BRIEF DESCRIPTION OF THE DRAWINGS

A detailed description will be made with reference to the accompanying drawings.

DETAILED DESCRIPTION

Figure 1:
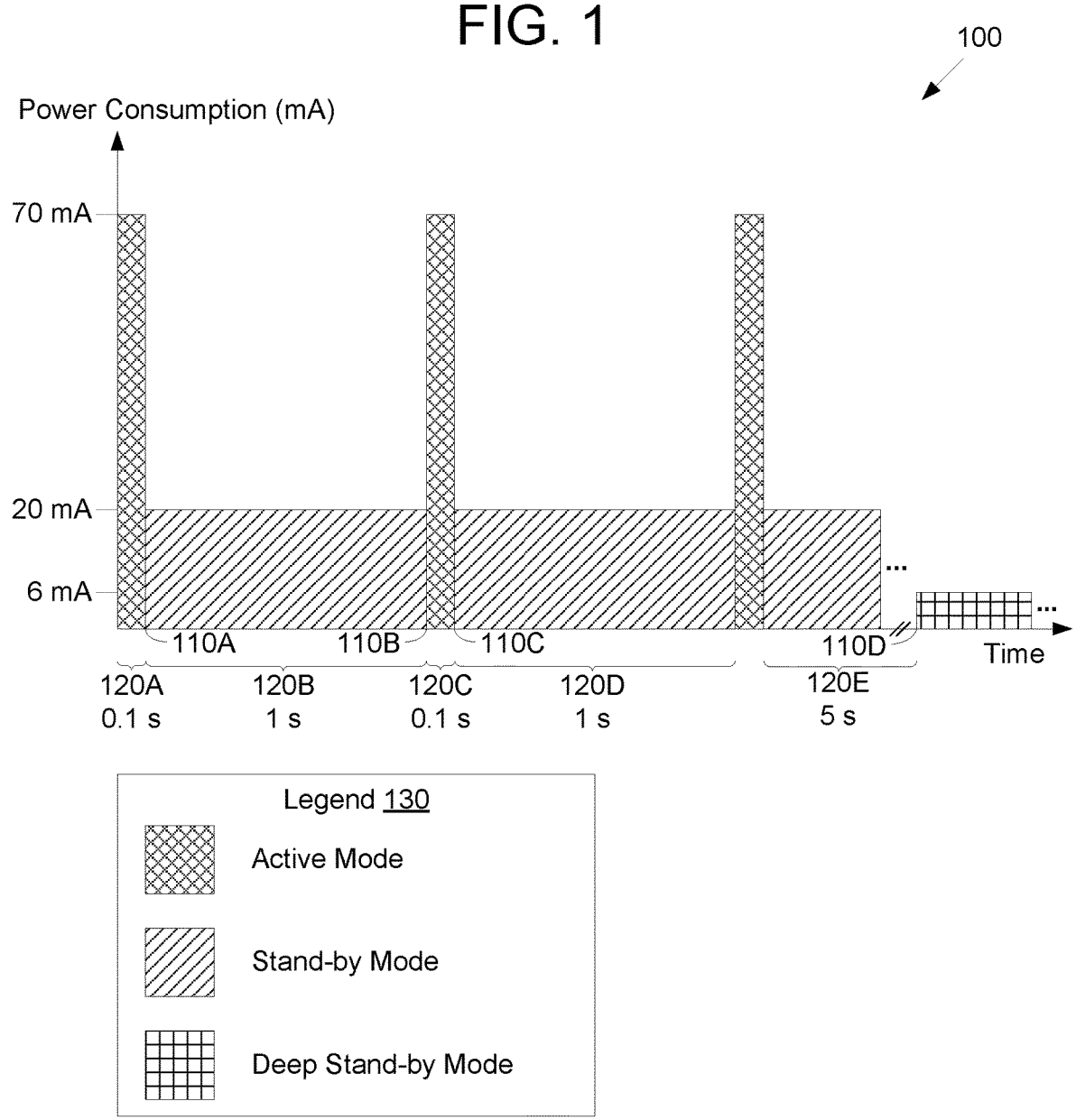
FIG. 1 is a chart illustrating power consumption over time for an example workload with periodic low I/O activity.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The present description relates in general to data storage systems, and more particularly to, for example, without limitation, efficient power management stand-by modes for multiple dies in a storage device. Storage devices may enter into low power stand-by modes to reduce power consumption during periods of low I/O activity. An ideal workload pattern for power management is a period of heavy I/O activity followed by an extended period of no I/O requests, which enables the storage device to smoothly transition to successively deeper and lower power stand-by modes. However, many application workloads may issue periodic read and write requests for smaller amounts of data even when the applications are not in active use. To service these requests in a timely fashion, storage devices may wake up from stand-by or extend an idle period before transitioning into a stand-by mode. Thus, the storage devices may be unable to transition to a deeper low power stand-by mode.

Flash-based storage devices such as not-and (NAND) flash storage devices may use multiple flash dies to provide improved I/O performance and greater storage capacity. Many devices and applications may require a low target leakage current during stand-by mode, for example, to meet battery life specifications, power budgets, or other metrics. To achieve a target leakage current profile, dies with marginal stand-by leakage current performance may be binned out for other applications. As a result, the use of multiple flash dies may reduce die yield for fabrication of high performance storage devices. The yield issue may be exacerbated by application workloads that cause the flash storage devices to remain in higher power modes, which in turn forces stricter target leakage current profiles.

One or more implementations of methods and systems are provided for efficient low leakage stand-by mode for multiple dies in a storage device. A storage device may select one or more dies as guard dies, which may be based on a leakage current profile for the guard dies. The guard dies may also change dynamically during active use of the storage device or other times. When a storage device transitions to a low power stand-by mode, the guard dies transition to a first low power stand-by mode whereas the remaining dies transition to a second low power stand-by mode. For example, the first mode may be a stand-by mode that can resume to active mode quickly, whereas the second mode may be a deep sleep stand-by mode that consumes less power and leaks less current compared to the first mode, but may require a longer wake-up period before resuming to active mode. In some aspects of the present technology, the deep sleep stand-by mode may be implemented by switching supply voltage to the individual dies.

During the low power stand-by mode, the storage device may still service I/O requests by activating the guard dies to service the I/O requests. Meanwhile, the remaining dies may remain in the second mode to reduce overall power consumption and leakage current. When a determination is made that the guard dies cannot adequately service one or more pending I/O requests, for example, if the requests cannot be serviced with the guard dies or a size of data for the I/O requests exceeds a wake-up threshold, then the storage device may transition back to active mode.

The subject technology provides several performance benefits that improve the functionality of a computer. In contrast to a power management approach that transitions to successively deeper stand-by modes using successively longer idle periods, implementations of the subject technology enable many dies to enter a deep sleep stand-by mode immediately upon entry into a first stand-by mode. Thus, reduced power consumption can be quickly achieved without waiting for multiple stand-by mode transitions. Further, by keeping one or more guard dies in a first mode that can quickly resume to active mode, the storage device can robustly service periodic I/O requests that may occur during application idle periods. As a result, the dies can stay in low power stand-by modes for longer periods before returning to active mode, further reducing power consumption. Power consumption can be further reduced by using supply voltage switching to turn off power completely for individual dies.

Further, since the stand-by leakage current is primarily from the guard dies rather than from all of the dies, storage devices can include dies with less optimal stand-by mode leakage current, which helps to improve yield and reduce fabrication costs. For example, each storage device may include a number of high performance, low stand-by leakage current dies that are preferably selected as guard dies, whereas the remaining dies can conform to less stringent leakage current targets. As a result, high-performance multi-die storage devices can provide stand-by mode leakage current performance that is similar to low-die count storage devices.

Yet further, the guard dies may dynamically change during operation of the storage device. For example, access statistics may be maintained for each die, recording whether a hit occurred (guard die was able to service an I/O request) or whether a miss occurred (a non-guard die needed to wake up to service an I/O request). Based on the hit and miss information, the guard die assignments may change to optimize for a higher hit to miss ratio.

Thus, the described methods and systems for efficient power management stand-by modes for multiple dies in a storage device provide several performance advantages that improve the functioning of the storage device. A host computer that interfaces with the storage device is also provided with improved functioning by reducing total power consumption. Thus, the described methods and systems provide performance benefits that improve the functioning of a storage device and a host computer.

FIG. 1 is a chart illustrating power consumption over time for an example workload with periodic low I/O activity. Chart 100 of FIG. 1 includes time 110A, time 110B, time 110C, time 110D, period 120A, period 120B, period 120C, period 120D, period 120E and legend 130.

Referring to FIG. 1, legend 130 identifies three power modes for an example storage device: an active mode, which may consume approximately 70 mA of current, a stand-by mode, which may consume approximately 20 mA of current, and a deep stand-by mode, which may consume approximately 6 mA of current. Of course, these are only example values and the specific values for each mode may vary depending on the storage device. Further, the current consumption level may vary within each power mode depending on the specific I/O operations conducted within a particular period. For illustration purposes, each power mode is assumed to consume a constant level of current.

Initially, the storage device may start in an active mode. The storage device may be configured to transition from the active mode to the stand-by mode after an idle period or idle threshold has elapsed wherein no I/O requests are received, for example 0.1 seconds. Thus, the storage device may transition to the stand-by mode at time 110A, or after period 120A having a length of 0.1 seconds wherein no I/O requests are received.

After period 120A, the storage device has transitioned to the stand-by mode. However, as discussed above, even when an application is idle, the application may still issue periodic I/O requests for small amounts of data. Thus, after period 120B, or 1 second, the storage device may receive an I/O request, e.g. a read or write request at time 110B. The storage device may quickly transition back to active mode to respond to the I/O request. For example, a wake up period for transitioning to active mode from the stand-by mode may complete in a few microseconds. After another idle period, or period 120C of 0.1 seconds, the storage device may return to the stand-by mode in period 120D starting at time 110C. Thus, as shown by chart 100, a workload of periodic I/O requests may cause the storage device to transition in and out of the active and stand-by modes. Further, since a periodic workload may not permit an extended idle period needed for transitioning to a deep stand-by mode, such as the 5 seconds of period 120E, such periodic workloads may prevent entry into the deep stand-by mode at time 110D where the largest saving in power consumption occurs. Accordingly, a different approach to power management is needed for storage devices.

Figure 2:
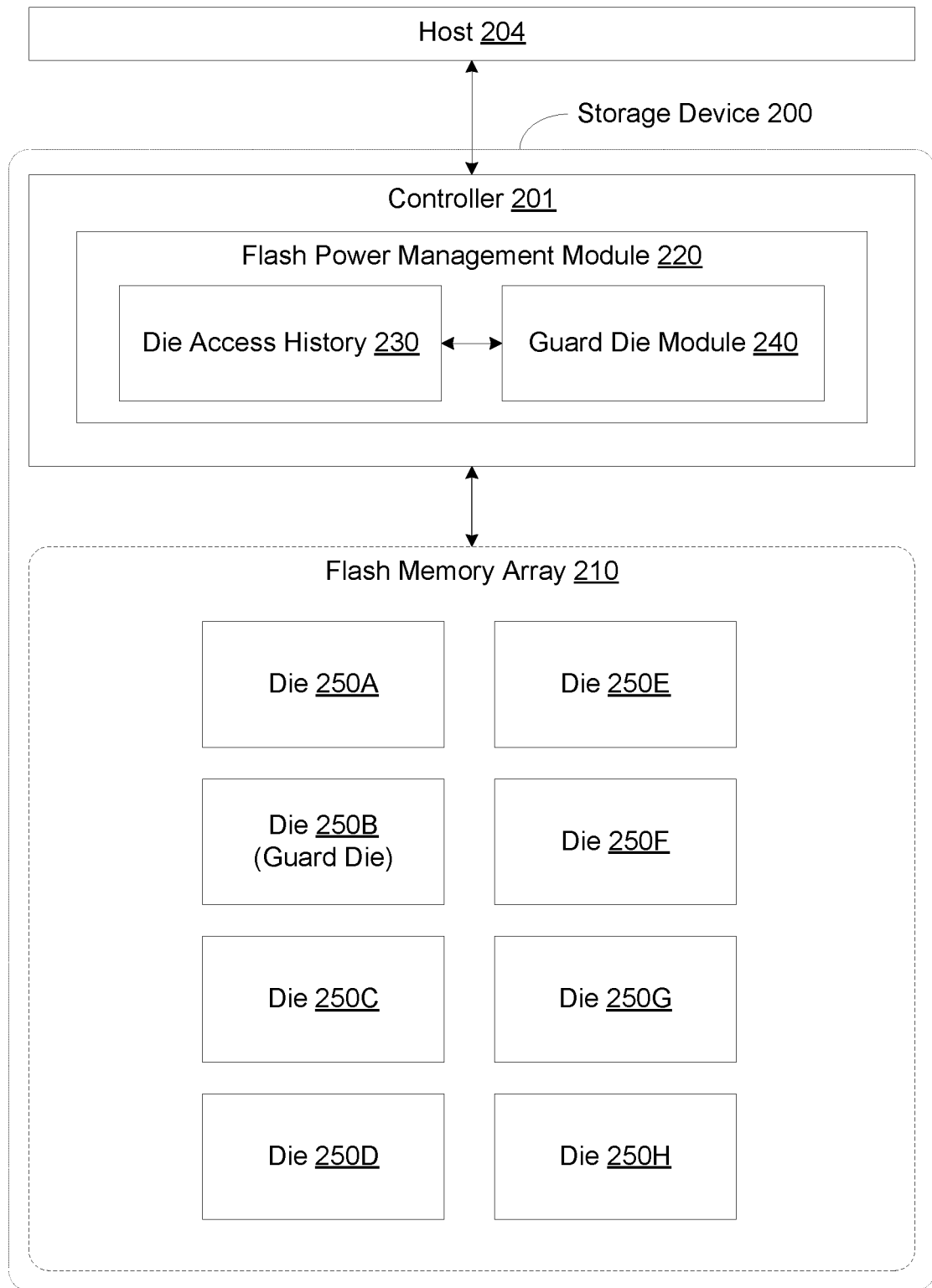
FIG. 2 is a block diagram illustrating example components of a flash storage device coupled to a host.

FIG. 2 is a block diagram illustrating example components of a flash storage device 200 coupled to a host 204. Storage device 200 includes controller 201 and flash memory array 210. Controller 201 includes flash power management module 220, which includes die access history 230 and guard die module 240. Flash memory array 210 includes die 250A, die 250B, die 250C, die 250D, die 250E, die 250F, die 250G, and die 250H.

As shown in FIG. 2, flash memory array 210 may include a plurality of memory dies. While eight (8) dies represented by dies 250A-250H are shown in FIG. 2, any number of flash memory dies may be supported. One or more dies, up to but not reaching the total number of dies, i.e., up to seven (7) dies in this example, may be selected as guard dies. However, to optimize power consumption, a smaller proportion of dies may be selected as guard dies, such as 25% or less of the available dies. The number of guard dies may also be based on previous operations of host 204. For example, if a periodic workload from host 204 tends to read from two specific dies, then the number of guard dies may be set as two dies. In the example shown in FIG. 2, a single die or die 250B is selected as the guard die.

The selection of die 250B as the guard die may be based on a leakage current profile of dies 250A-250H. For example, die 250B may be identified as having a lowest leakage current in the stand-by mode, and may thus be preferentially selected as the guard die. In another example, a subset of the dies with the lowest leakage currents may be rotated in a round-robin or another load balancing scheme to select the guard die(s). Thus, the selection of the guard die may be based on a whether the guard die was previously selected as a guard die, e.g. how recently, how often, and/or how long the guard die was previously selected, and/or how much data was previously written to the guard die.

Besides the leakage current profile, other criteria may be used to select the guard die(s). For example, flash power management module 220 may maintain die access history 230, which may track I/O access for dies 250A-250H when storage device 200 is in a stand-by mode. For example, if a guard die successfully services an I/O request for reading data, then a "hit" may be recorded for the guard die in die access history 230. If a non-guard die is awakened to service an I/O request for reading data, then a "miss" may be recorded for the non-guard die in die access history 230. Based on the hits and misses in die access history 230, guard die module 240 may select one or more guard dies to keep frequently accessed data within guard dies. In this manner, a larger proportion of I/O requests can be serviced by the guard dies without returning to the active mode. Guard die module 240 may dynamically update guard die assignments as die access history 230 is updated during the operation of storage device 200, for example by updating on a periodic basis or by data activity level.

When controller 201 receives a message to transition to a low power stand-by mode, for example as described above with respect to time 110A and time 110C, a conventional flash power management module may instruct dies 250A-250H to transition to a low power stand-by mode. However, as illustrated in FIG. 1 above, this may result in back and forth between the active mode and the stand-by mode due to periodic workloads, which prevents entry into the power efficient deep stand-by mode.

Accordingly, guard die module 240 of flash power management module 220 may respond to the message to transition to the low power stand-by mode by instructing die 250B to enter the stand-by mode, and by instructing the remaining dies, or dies 250A and 250C-250H, to enter the deep stand-by mode. Since 7 of 8 dies are in the deep stand-by mode and 1 of 8 dies is in the stand-by mode, the power consumption for flash memory array 210 in FIG. 2 may be approximately 7.75 mA, or very close to the 6 mA deep stand-by mode consumption level shown in FIG. 1.

Further, if controller 201 receives an I/O request while storage device 200 is in the stand-by mode, controller 201 may be able to service the I/O request without returning to the active mode, further reducing power consumption. For example, if the I/O request is a read request and controller 201 has the capacity to service the read request, for example if die 250B stores the data to answer the read request, then controller 201 may wake up die 250B, process the read request, and transition die 250B back to the stand-by mode. While processing the read request, dies 250A and 250C-250H can remain in the deep stand-by mode. However, if it is not possible to service the I/O request, for example if the read request is for data stored on non-guard die such as die 250F, then storage device 200 may return to the active mode, for example by waking all of the dies 250A-250H.

If the I/O request is a write request, then the I/O request may be serviced if the guard dies have sufficient capacity to perform the write request, for example by having sufficient free space available. However, even if sufficient capacity is available, the guard dies may refuse the I/O request if a size of the write request satisfies a wake up threshold. For example, if one or more write requests are queued that exceed the wake up threshold, then it may be faster to transition to active mode and service the write requests by writing to multiple dies in parallel instead of forcing the write requests to be serviced by the guard dies. Thus, the wake up threshold may be set to balance write performance against power consumption.

Figure 3:
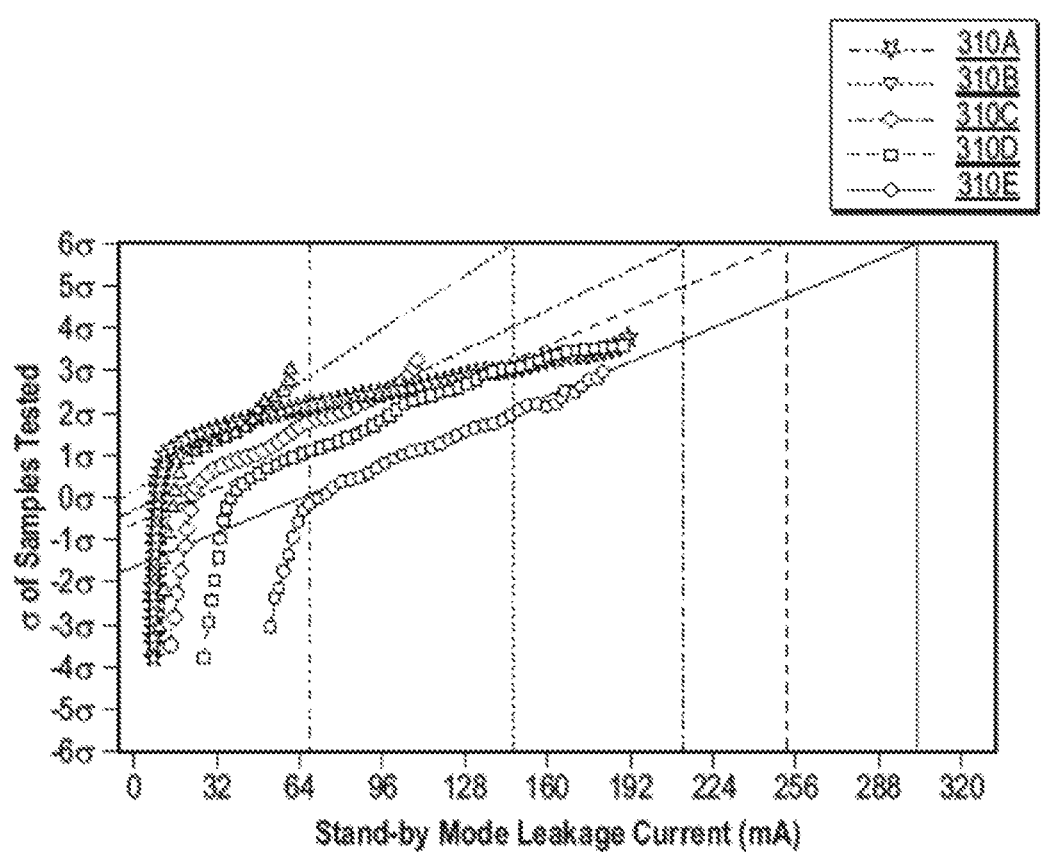
FIG. 3 is a sigma plot illustrating example stand-by mode leakage currents for storage devices with different die quantities.

FIG. 3 is a sigma plot illustrating example stand-by mode leakage currents for storage devices with different die quantities. FIG. 3 includes plot 310A, plot 310B, plot 310C, plot 310D, and plot 310E. As shown in FIG. 3, the horizontal X axis is the stand-by mode leakage current, whereas the vertical Y axis is the sigma probability to get the indicated leakage current within a respective distribution of storage device package samples.

Plot 310A may correspond to a distribution for a storage device with no dies in the device packaging (control), whereas plot 310B, 310C, 310D, and 310E may respectively correspond to a distribution for a storage device with 1, 2, 4 and 8 dies. As shown in FIG. 3, the stand-by mode leakage current tends to increase with the number of dies. Device Original Equipment Manufacturers (OEMs) may specify a maximum allowable stand-by mode leakage current according to the power consumption requirements of their devices, which may be represented by drawing a vertical line in FIG. 3. The majority of a distribution plot should be to the left of the vertical line to meet OEM requirements. By using the described system and methods of efficient low leakage stand-by mode for multiple dies, a storage device may provide leakage current performance similar to plot 310B, or the single die package, while providing the performance and capacity of multiple dies, such as 8 or more dies. Thus, OEM power consumption requirements can more easily achieved while improving die yield by using less stringent binning to reach a target leakage current profile, providing benefits for the flash memory manufacturer, the storage device manufacturer, and the device OEM.

Figure 4:
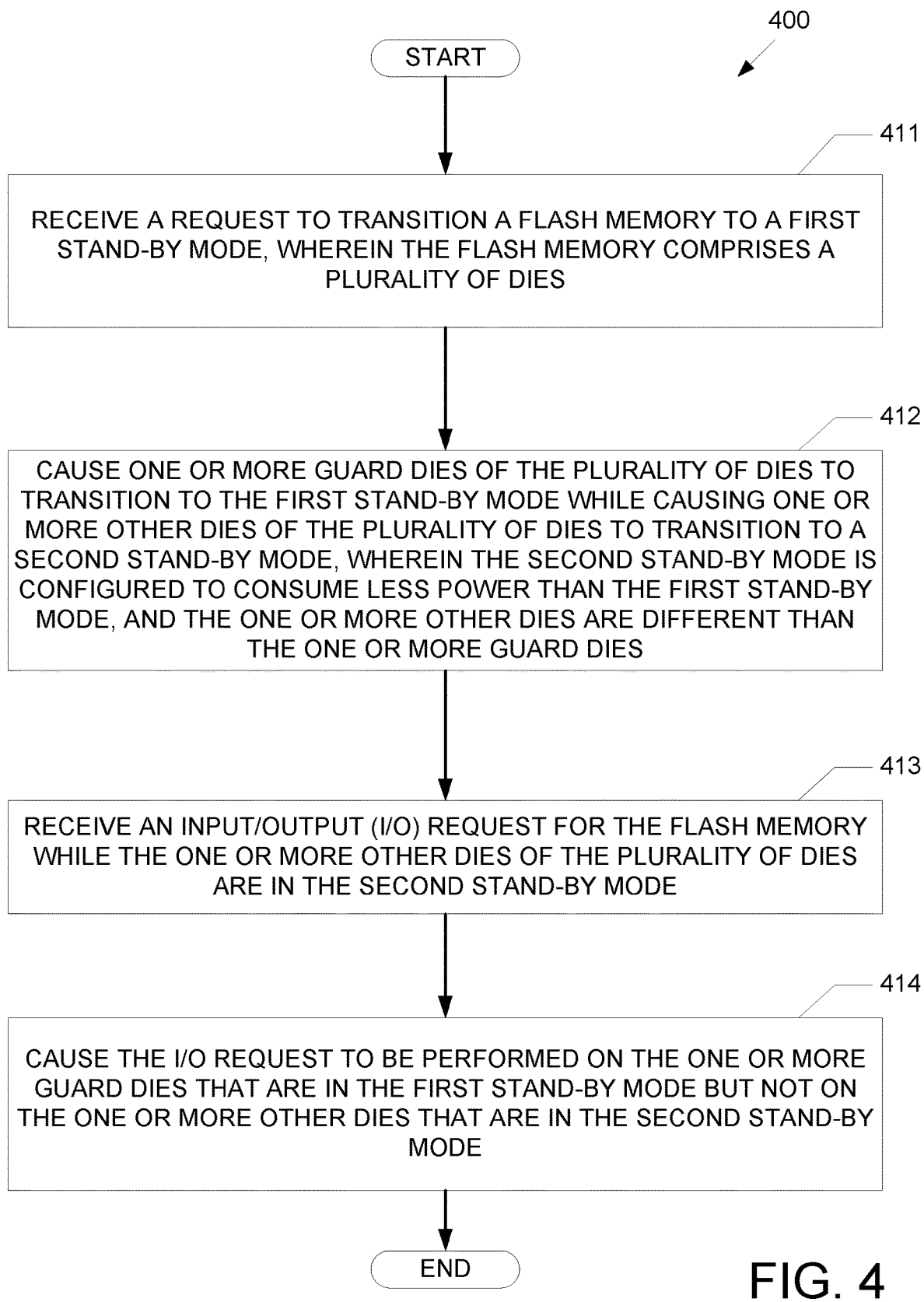
FIG. 4 is a flowchart illustrating an example process for providing efficient power management for storage devices with multiple dies.

FIG. 4 is a flowchart illustrating an example process 400 for providing efficient power management for storage devices with multiple dies, according to aspects of the subject technology. One or more blocks of FIG. 4 may be executed by a computing system (including, e.g., a controller of a flash memory, a data storage controller of a data storage system or a solid state storage device (SSD), a processor, or the like). Examples of a computing system or a controller may be controller 201, 501, 507 and/or 601. Similarly, a non-transitory machine-readable medium may include machine-executable instructions thereon that, when executed by a computer or machine, perform the blocks of FIG. 4.

In block 411, referring to FIG. 2, controller 201 receives a request to transition flash memory array 210 to a first stand-by mode, wherein flash memory array 210 comprises a plurality of dies 250A-250H. For example, the first stand-by mode may correspond to the stand-by mode in FIG. 1. The request may be received from host 204, or may originate from firmware or software executing on controller 201. The request may also be in response to detecting an idle threshold has been satisfied for flash memory array 210. For example, if flash memory array 210 has been idle for 0.1 seconds or more, then the idle threshold may be satisfied.

In block 412, referring to FIG. 2, controller 201 causes die 250B to transition to the first stand-by mode while causing dies 250A and 250C-250H to transition to a second stand-by mode. The second stand-by mode is configured to consume less power than the first stand-by mode. For example, the second stand-by mode may correspond to the deep stand-by mode in FIG. 1. Thus, guard die module 240 may send one or more messages to flash memory array 210 to cause die 250B to transition to the first stand-by mode and dies 250A and 250C-250H to transition to the second stand-by mode, for example by sending power management messages through a communication bus.

In block 413, referring to FIG. 2, controller 201 receives an input/output (I/O) request for flash memory array 210 while dies 250A and 250C-250H are in the second stand-by mode. For example, host 204 may send a read or write request to controller 201. As discussed above, these I/O requests may occur in a periodic fashion even when an application of host 204 is in an idle state.

In block 414, referring to FIG. 2, controller 201 causes the I/O request to be performed on die 250B that is in the first stand-by mode but not on dies 250A and 250C-250H that are in the second stand-by mode. As discussed above, controller 201 may determine whether the guard die(s), or die 250B, can satisfy the I/O request without waking the other dies. If the I/O request can be satisfied by die 250B, then controller 201 may cause die 250B to awaken, perform the I/O request using die 250B, and cause die 250B to transition back to the first stand-by mode. Otherwise, if the I/O request cannot be satisfied by die 250B, then controller 201 may transition storage device 200 back to the active mode and may cause all dies 250A-250H to awaken.

Figure 5:
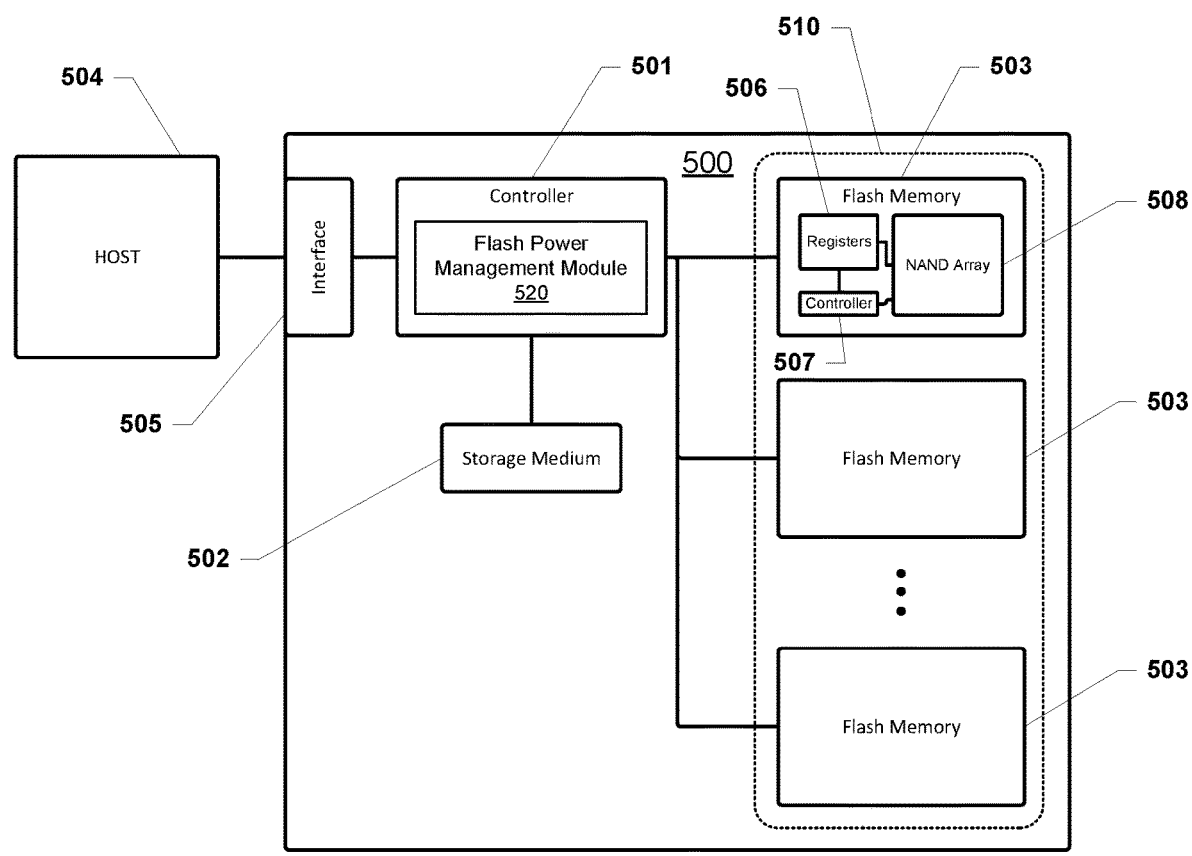
FIG. 5 is a block diagram illustrating components of an example data storage system.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory array 510 including one or more flash memory 503. Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board. Controller 501 may include flash power management module 520, which may be implemented as hardware/firmware or software and may correspond to flash power management module 220 of FIG. 2.

With respect to FIG. 5 and FIG. 2, like numbered elements may correspond to the same element. For example, host 504 may correspond to host 204, data storage system 500 may correspond to storage device 200, controller 501 may correspond to controller 201, and flash memory array 510 may correspond to flash memory array 210. Each flash memory 503 may contain one or more dies, which may correspond to dies 250A-250H.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules. While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Controller 501 may perform the operations identified in blocks 411-414. Controller 501 may cause the operations identified in blocks 411-414 to occur, or controller 501 may provide instructions to cause or facilitate controller 507 (and registers 506) to perform operations identified in blocks 411-414.

Figure 6:
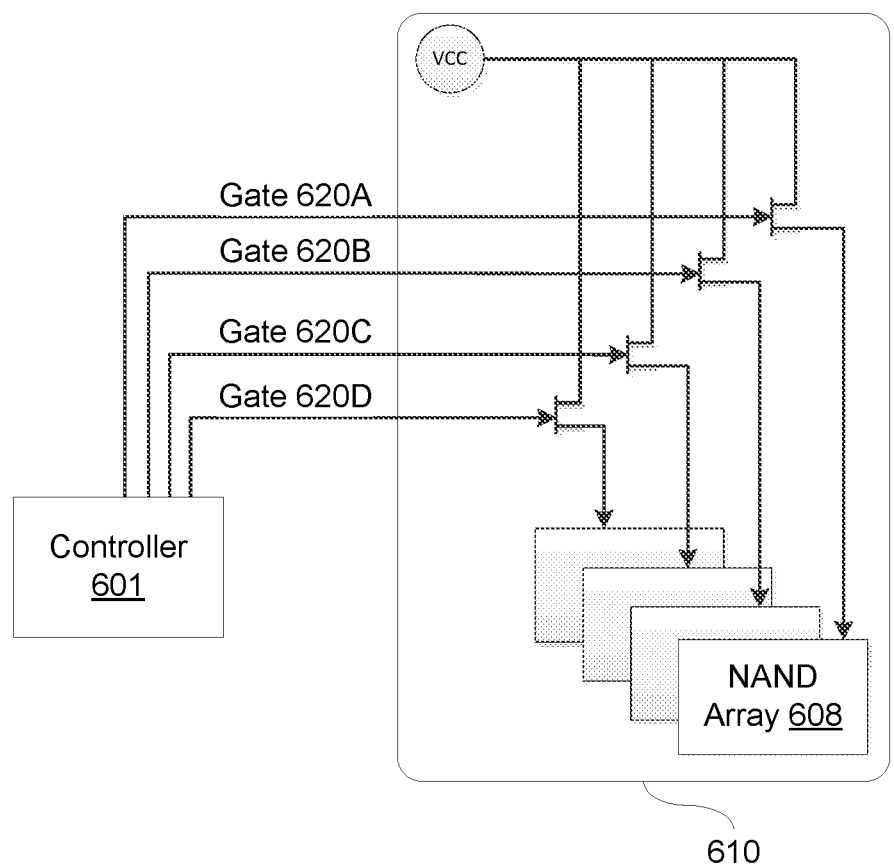
FIG. 6 is a block diagram illustrating an example data storage system using supply voltage switching.

FIG. 6 is a block diagram illustrating an example data storage system using supply voltage switching. FIG. 6 includes controller 601, gate 620A, gate 620B, gate 620C, gate 620D, flash memory array 610, and NAND array 608. With respect to FIG. 6 and FIG. 5, like numbered elements may correspond to the same element. For example, controller 601 may correspond to controller 501, flash memory array 610 may correspond to flash memory array 510, and NAND array 608 may correspond to NAND array 508.

As shown in FIG. 6, controller 601 may control the supply voltage (VCC) to each individual NAND array 608 via gates 620A-620D. Thus, assuming that the storage device depicted in FIG. 6 includes 4 dies of flash memory, each die corresponding to NAND array 608 may be individually switched on or off by controlling the flow of VCC using gates 620A-620D. Thus, the second stand-by mode described in process 400 above can be extended to a complete power off state instead of a deep stand-by state, which reduces power consumption even further.

A drawback of the supply voltage switching approach in FIG. 6 is that waking up dies from a power off state may require a longer wake-up time compared to the deep stand-by mode. Thus, a decision whether to use voltage switched die power management may depend on individual device latency and power consumption requirements. In some aspects of the present technology, the voltage switched die power management may be a host definable setting.

Various examples of aspects of the disclosure are described below. These are provided as examples, and do not limit the subject technology.

One or more aspects of the subject technology provide methods to provide an efficient low leakage stand-by mode for multiple dies in a storage device. According to some aspects, a method may include receiving a request to transition a flash memory to a first stand-by mode, wherein the flash memory comprises a plurality of dies. The method may also include causing one or more guard dies of the plurality of dies to transition to the first stand-by mode while causing one or more other dies of the plurality of dies to transition to a second stand-by mode, wherein the second stand-by mode is configured to consume less power than the first stand-by mode, and the one or more other dies are different than the one or more guard dies. The method may also include receiving an input/output (I/O) request for the flash memory while the one or more other dies of the plurality of dies are in the second stand-by mode. The method may also include causing the I/O request to be performed on the one or more guard dies that are in the first stand-by mode but not on the one or more other dies that are in the second stand-by mode.

In other aspects, a data storage device may include a flash memory comprising a plurality of dies, and a controller. The controller may be configured to receive a request to transition a flash memory to a first stand-by mode, wherein the flash memory comprises a plurality of dies. The controller may also be configured to cause one or more guard dies of the plurality of dies to transition to the first stand-by mode and causing one or more other dies of the plurality of dies to transition to a second stand-by mode, wherein the second stand-by mode is configured to consume less power than the first stand-by mode. The controller may also be configured to receive an input/output (I/O) request for the flash memory. The controller may also be configured to cause the I/O request to be performed on the one or more guard dies that are in the first stand-by mode but not on the one or more other dies that are in the second stand-by mode.

In further aspects, a non-transitory machine-readable medium including machine-executable instructions thereon that, when executed by a processor, perform a method. The method may include receiving a request to transition a flash memory to a first stand-by mode, wherein the flash memory comprises a plurality of dies. The method may also include causing one or more guard dies of the plurality of dies to transition to the first stand-by mode while causing one or more other dies of the plurality of dies to transition to a second stand-by mode, wherein the second stand-by mode is configured to consume less power than the first stand-by mode. The method may also include receiving an input/output (I/O) request for the flash memory while the one or more other dies of the plurality of dies are in the second stand-by mode. The method may also include causing the I/O request to be performed on the one or more guard dies that are in the first stand-by mode but not on the one or more other dies that are in the second stand-by mode.

In further aspects, a system may include means for receiving a request to transition a flash memory to a first stand-by mode, wherein the flash memory comprises a plurality of dies. The system may also include means for causing one or more guard dies of the plurality of dies to transition to the first stand-by mode while causing one or more other dies of the plurality of dies to transition to a second stand-by mode, wherein the second stand-by mode is configured to consume less power than the first stand-by mode, and the one or more other dies are different than the one or more guard dies. The system may also include means for receiving an input/output (I/O) request for the flash memory while the one or more other dies of the plurality of dies are in the second stand-by mode. The system may also include means for causing the I/O request to be performed on the one or more guard dies that are in the first stand-by mode but not on the one or more other dies that are in the second stand-by mode.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A data storage system, comprising:
   a memory system comprising a plurality of memory devices; and
   one or more controllers configured to cause:
   instructing one or more memory devices of the plurality of memory devices to transition to a first non-active mode;

instructing one or more other memory devices of the plurality of memory devices to transition to a second non-active mode, wherein the second non-active mode is configured to consume less power than the first non-active mode;

obtaining an operational request for the memory system; and performing the operational request on the one or more memory devices that are in the first non-active mode but not on the one or more other memory devices that are in the second non-active mode.

2. The data storage system of claim 1, wherein the one or more controllers are further configured to cause:
in response to a request to transition the memory system to the first non-active mode:
instructing the one or more memory devices of the plurality of memory devices to transition to the first non-active mode; and
instructing the one or more other memory devices of the plurality of memory devices to transition to the second non-active mode.

3. The data storage system of claim 2, wherein the request to transition the memory system to the first non-active mode is in response to detecting that a first idle threshold has been satisfied for the memory system.

4. The data storage system of claim 1, wherein obtaining the operational request comprises obtaining the operational request while the one or more other memory devices of the plurality of memory devices are in the second non-active mode.

5. The data storage system of claim 1, wherein the one or more controllers are further configured to cause:
selecting the one or more memory devices from the plurality of memory devices based on one or more of: a leakage profile of the plurality of memory devices, a prior history of selecting memory devices from the plurality of memory devices, and a previous operation of a host computer associated with the memory system.

6. The data storage system of claim 1, wherein the one or more controllers are further configured to cause:
selecting the one or more memory devices from the plurality of memory devices based on an access history of request hits and misses recorded for the plurality of memory devices.

7. The data storage system of claim 1, wherein the one or more controllers are further configured to cause performing the operational request in response to determining that the one or more memory devices have capacity to perform the operational request.

8. The data storage system of claim 7, wherein the operational request is a read request, and wherein determining that the one or more memory devices have capacity comprises determining that data for the read request is stored in the one or more memory devices.

9. The data storage system of claim 7, wherein the operational request is a write request, and wherein determining that the one or more memory devices have capacity comprises determining that a size of data for the write request does not satisfy a wake up threshold.

10. The data storage system of claim 1, further comprising:
one or more gates coupled to the plurality of memory devices and configured to be coupled to a supply voltage,
wherein the one or more controllers are further configured to instruct the one or more other memory devices to transition to the second non-active mode by using the one or more gates to switch off the supply voltage to the one or more other memory devices that are in the second non-active mode.

11. A method, comprising:
instructing one or more memory devices of a plurality of memory devices to transition to a first non-active mode, wherein a memory system comprises the plurality of memory devices;
instructing one or more other memory devices of the plurality of memory devices to transition to a second non-active mode, wherein the second non-active mode is configured to consume less power than the first non-active mode;
obtaining an operational request for the memory system; and
performing the operational request on the one or more memory devices that are in the first non-active mode but not on the one or more other memory devices that are in the second non-active mode.

12. The method of claim 11, wherein in response to a request to transition the memory system to the first non-active mode:
the one or more memory devices of the plurality of memory devices are transitioned to the first non-active mode; and
the one or more other memory devices of the plurality of memory devices are transitioned to the second non-active mode.

13. The method of claim 12, wherein the request to transition the memory system to the first non-active mode is in response to detecting a first idle threshold has been satisfied for the memory system.

14. The method of claim 11, wherein obtaining the operational request comprises obtaining the operational request while the one or more other memory devices of the plurality of memory devices are in the second non-active mode.

15. The method of claim 11, further comprising:
selecting the one or more memory devices from the plurality of memory devices based on one or more of: a leakage profile of the plurality of memory devices, a prior history of selecting memory devices from the plurality of memory devices, and a previous operation of a host computer associated with the memory system.

16. The method of claim 11, wherein the operational request is a read request, and wherein the operational request is performed on the one or more memory devices in response to determining that data for the read request is stored in the one or more memory devices.

17. The method of claim 11, wherein the operational request is a write request, and wherein the operational request is performed on the one or more memory devices in response to determining that a size of data for the write request does not satisfy a wake up threshold.

18. The method of claim 11, wherein the second non-active mode causes the memory system to use one or more circuit components to switch off a supply voltage to each of the one or more other memory devices that are in the second non-active mode.

19. An apparatus, comprising:
means for instructing one or more memory devices of a plurality of memory devices to transition to a first non-active mode, wherein a memory system comprises the plurality of memory devices;
means for instructing one or more other memory devices of the plurality of memory devices to transition to a second non-active mode, wherein the second non-active mode is configured to consume less power than the first non-active mode;

means for obtaining an operational request for the memory system; and means for performing the operational request on the one or more memory devices that are in the first non-active mode but not on the one or more other memory devices that are in the second non-active mode.

20. The apparatus of claim 19, wherein:

the means for instructing the one or more memory devices comprises means for instructing the one or more memory devices of the plurality of memory devices to transition to the first non-active mode, in response to a request to transition the memory system to the first non-active mode; and the means for instructing the one or more other memory devices comprises means for instructing the one or more other memory devices of the plurality of memory devices to transition to the second non-active mode, in response to the request to transition the memory system to the first non-active mode.

\* \* \* \* \*